(12) United States Patent
Jung et al.

(10) Patent No.: US 11,203,662 B2
(45) Date of Patent: Dec. 21, 2021

(54) POLYMER, ORGANIC LAYER COMPOSITION, AND METHOD OF FORMING PATTERNS

(71) Applicant: SAMSUNG SDI CO., LTD., Yongin-si (KR)

(72) Inventors: Hyeonil Jung, Suwon-si (KR); Sunghwan Kim, Suwon-si (KR); Seunghyun Kim, Suwon-si (KR); Yushin Park, Suwon-si (KR); Jaebum Lim, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 253 days.

(21) Appl. No.: 16/339,451

(22) PCT Filed: Jul. 21, 2017

(86) PCT No.: PCT/KR2017/007906
§ 371 (c)(1),
(2) Date: Apr. 4, 2019

(87) PCT Pub. No.: WO2018/088673
PCT Pub. Date: May 17, 2018

(65) Prior Publication Data
US 2019/0233576 A1    Aug. 1, 2019

(30) Foreign Application Priority Data

Nov. 10, 2016 (KR) .......................... 10-2016-0149859
Apr. 28, 2017 (KR) .......................... 10-2017-0055623

(51) Int. Cl.
C08G 61/12 (2006.01)
H01L 21/033 (2006.01)
(Continued)

(52) U.S. Cl.
CPC ........... *C08G 61/124* (2013.01); *C08G 61/02* (2013.01); *C08G 61/10* (2013.01); *C08G 61/12* (2013.01);
(Continued)

(58) Field of Classification Search
CPC ...... C08G 61/124; C08G 61/02; C08G 61/12; C08G 61/10; C08G 2261/1414;
(Continued)

(56) References Cited

U.S. PATENT DOCUMENTS

2015/0044876 A1    2/2015    Nishimaki et al.
2016/0090449 A1    3/2016    Nam et al.
(Continued)

FOREIGN PATENT DOCUMENTS

CN    105646850 A    6/2016
CN    105885018 A    8/2016
(Continued)

OTHER PUBLICATIONS

European Search Report in European Patent Application No. 17868972.5.
(Continued)

*Primary Examiner* — Caleen O Sullivan
(74) *Attorney, Agent, or Firm* — Lee IP Law, P.C.

(57) ABSTRACT

Disclosed are a polymer including a structural unit represented by Chemical Formula 1 and a structural unit represented by Chemical Formula 2, an organic layer composition including the polymer, and a method of forming patterns using the organic layer composition.

[Chemical Formula 1]

(Continued)

-continued

[Chemical Formula 2]

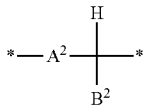

The Chemical Formulae 1 and 2 are the same as defined in the specification.

15 Claims, 1 Drawing Sheet

(51) Int. Cl.
    *H01L 21/027*     (2006.01)
    *H01L 21/02*     (2006.01)
    *C08G 61/10*     (2006.01)
    *G03F 7/16*     (2006.01)
    *G03F 7/20*     (2006.01)
    *G03F 7/26*     (2006.01)
    *C09D 165/00*     (2006.01)
    *C08G 61/02*     (2006.01)
    *G03F 7/09*     (2006.01)
    *G03F 7/00*     (2006.01)
    *H01L 21/3213*     (2006.01)
    *H01L 21/308*     (2006.01)
    *H01L 21/311*     (2006.01)

(52) U.S. Cl.
CPC ............. *C09D 165/00* (2013.01); *G03F 7/00* (2013.01); *G03F 7/09* (2013.01); *G03F 7/162* (2013.01); *G03F 7/168* (2013.01); *G03F 7/20* (2013.01); *G03F 7/26* (2013.01); *H01L 21/027* (2013.01); *H01L 21/0276* (2013.01); *H01L 21/02118* (2013.01); *H01L 21/02282* (2013.01); *H01L 21/033* (2013.01); *H01L 21/0332* (2013.01); *C08G 2261/11* (2013.01); *C08G 2261/148* (2013.01); *C08G 2261/1414* (2013.01); *C08G 2261/1422* (2013.01); *C08G 2261/228* (2013.01); *C08G 2261/314* (2013.01); *C08G 2261/3241* (2013.01); *H01L 21/3081* (2013.01); *H01L 21/31144* (2013.01); *H01L 21/32139* (2013.01)

(58) Field of Classification Search
CPC .......... C08G 2261/11; C08G 2261/228; C08G 2261/3241; C08G 2261/314; C08G 2261/148; C08G 2261/1422; C08G 14/06; C08G 2261/124; C08G 2261/3326; H01L 21/027; H01L 21/033; H01L 21/0276; H01L 21/02282; H01L 21/02118; H01L 21/0332; H01L 21/32139; H01L 21/3081; H01L 21/31144; G03F 7/09; G03F 7/00; G03F 7/162; G03F 7/168; G03F 7/20; G03F 7/26; G03F 7/0752; G03F 7/094; C09D 165/00; C09D 161/34
USPC ........................ 430/270.1, 271.1, 272.1, 311
See application file for complete search history.

(56) References Cited

U.S. PATENT DOCUMENTS

| | | |
|---|---|---|
| 2016/0152771 A1 | 6/2016 | Mun et al. |
| 2017/0110328 A1* | 4/2017 | Kwon .................. C08G 14/04 |

FOREIGN PATENT DOCUMENTS

| | | |
|---|---|---|
| JP | 2006-293207 A | 10/2006 |
| JP | 2014-029435 A | 2/2014 |
| JP | 2015-127821 A | 7/2015 |
| JP | 5867732 B2 | 2/2016 |
| JP | 2016-151024 A | 8/2016 |
| KR | 10-2011-0079201 A | 7/2011 |
| KR | 10-1174086 B1 | 8/2012 |
| KR | 10-2013-0046498 A | 5/2013 |
| KR | 10-2013-0130005 A | 11/2013 |
| KR | 10-2014-0122225 A | 10/2014 |
| KR | 10-2014-0144207 A | 12/2014 |
| KR | 10-2015-0022679 A | 3/2015 |
| KR | 10-2015-0043380 A | 4/2015 |
| KR | 10-2016-0010170 A | 1/2016 |
| KR | 10-1599961 B1 | 2/2016 |
| KR | 10-2016-0101583 A | 8/2016 |
| KR | 10-2017-0045592 A | 4/2017 |
| KR | 10-1829750 B1 | 2/2018 |
| TW | 201612214 A | 4/2016 |
| TW | 201630965 A | 9/2016 |
| TW | 201714912 A | 5/2017 |
| WO | WO 2012/077640 A1 | 6/2012 |
| WO | WO 2013/080929 A1 | 6/2013 |
| WO | WO 2013/146670 A1 | 10/2013 |
| WO | WO 2016/021594 A1 | 2/2016 |
| WO | WO 2017-115978 A1 | 6/2017 |
| WO | WO 2018-021619 A1 | 1/2018 |

OTHER PUBLICATIONS

International Search Report for PCT/KR2017/007906 filed on Jul. 21, 2017.

* cited by examiner

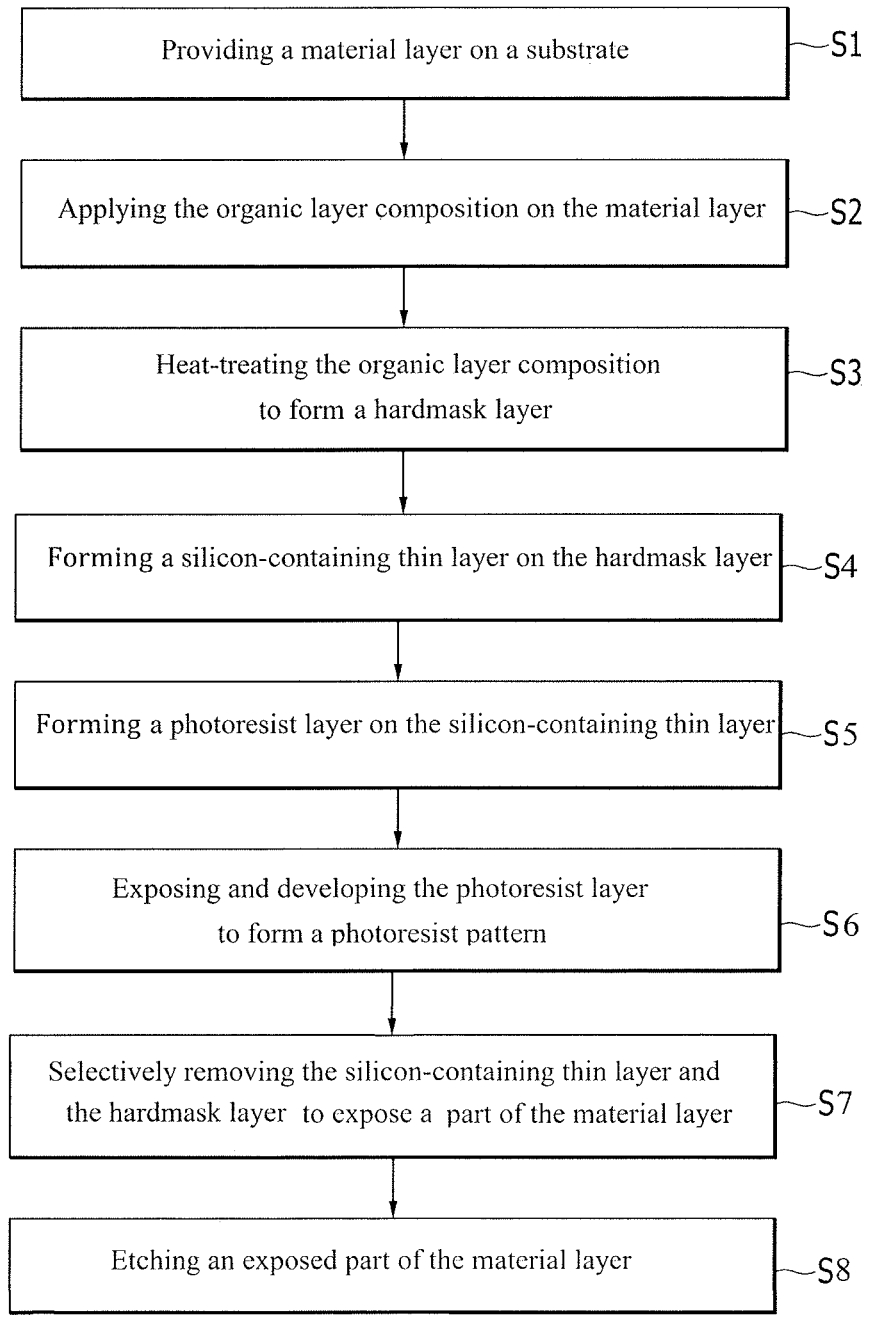

POLYMER, ORGANIC LAYER COMPOSITION, AND METHOD OF FORMING PATTERNS

CROSS-REFERENCE TO THE RELATED APPLICATION

This is the U.S. national phase application based on PCT Application No. PCT/KR2017/007906, filed Jul. 21, 2017, which is based on Korean Patent Application No. 10-2016-0149859, filed Nov. 10, 2016 and Korean Patent Application No. 10-2017-0055623 filed on Apr. 28, 2017, the entire contents of all of which are hereby incorporated by reference.

BACKGROUND OF THE INVENTION

(a) Field of the Invention

A novel polymer, an organic layer composition including the polymer, and a method of forming patterns using the organic layer composition are disclosed.

(b) Description of the Related Art

Recently, the semiconductor industry has developed to an ultra-fine technique having a pattern of several to several tens nanometer size. Such ultrafine technique essentially needs effective lithographic techniques. The typical lithographic technique includes providing a material layer on a semiconductor substrate; coating a photoresist layer thereon; exposing and developing the same to provide a photoresist pattern; and etching a material layer using the photoresist pattern as a mask. Nowadays, according to small-sizing the pattern to be formed, it is difficult to provide a fine pattern having an excellent profile by only above-mentioned typical lithographic technique. Accordingly, a layer, called a hardmask layer, may be formed between the material layer and the photoresist layer to provide a fine pattern. The hardmask layer plays a role of an intermediate layer for transferring the fine pattern of photoresist to the material layer through the selective etching process. Accordingly, the hardmask layer is required to have characteristics such as heat resistance and etch resistance to be tolerated during the multiple etching processes. On the other hand, a spin-on coating method instead of a chemical vapor deposition (CVD) method has recently been suggested to form the hardmask layer. The spin-on coating method may not only be easily performed but also improve gap-fill characteristics and planarization characteristics. Herein, the gap-fill characteristics of filling the patterns without a void are required, since the fine pattern may be realized by necessarily forming multi patterns. In addition, the surface of the hardmask layer needs to be planarized by an underlayer, when a substrate has a step, or when a pattern-close region and no pattern region are present together on a wafer. There are needs for an organic layer material satisfying characteristics that are required for a hardmask layer.

SUMMARY OF THE INVENTION

An embodiment provides a novel polymer having improved heat resistance and etch resistance while ensuring solubility.

Another embodiment provides an organic layer composition including the polymer.

Yet another embodiment provides a method of forming patterns using the organic layer composition.

According to an embodiment, a polymer includes a structural unit represented by Chemical Formula 1 and a structural unit represented by Chemical Formula 2.

[Chemical Formula 1]

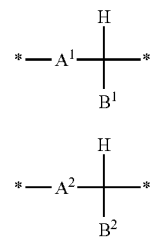

[Chemical Formula 2]

In Chemical Formulae 1 and 2, $A^1$ is a moiety represented by Chemical Formula X, $A^2$ is a substituted or unsubstituted C6 to C30 aromatic ring and has a different structure from $A^1$, $B^1$ and $B^2$ are independently a substituted or unsubstituted C6 to C30 aromatic ring, and

* is a linking point:

[Chemical Formula X]

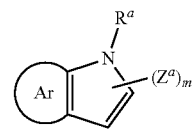

wherein, in Chemical Formula X,

Ar is a substituted or unsubstituted tetragonal ring, a substituted or unsubstituted pentagonal ring, a substituted or unsubstituted hexagonal ring, or a fused ring thereof, $R^a$ is hydrogen, a hydroxy group, a halogen, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof, $Z^a$ is independently hydroxy group, a halogen, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof, and m is 0 or 1.

In Chemical Formulae 1 and 2, $B^1$ and $B^2$ may independently be one of substituted or unsubstituted moieties of Group 1.

[Group 1]

[Group 1]

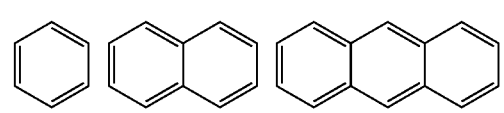

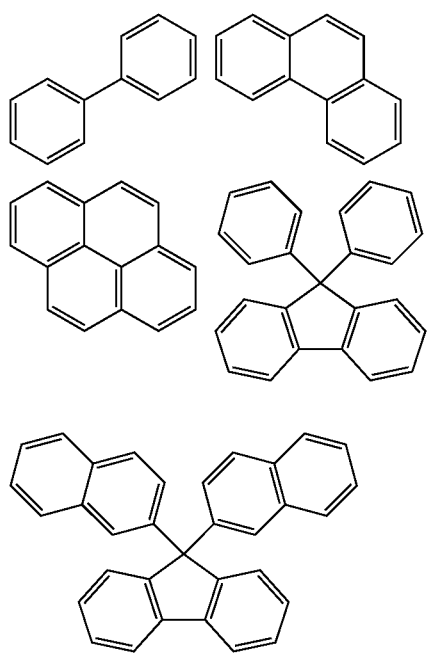
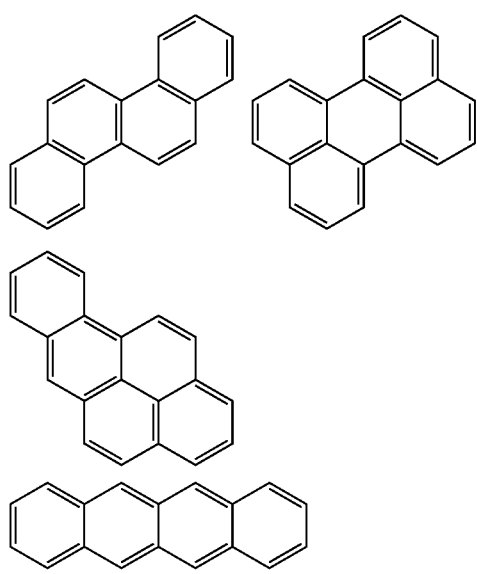
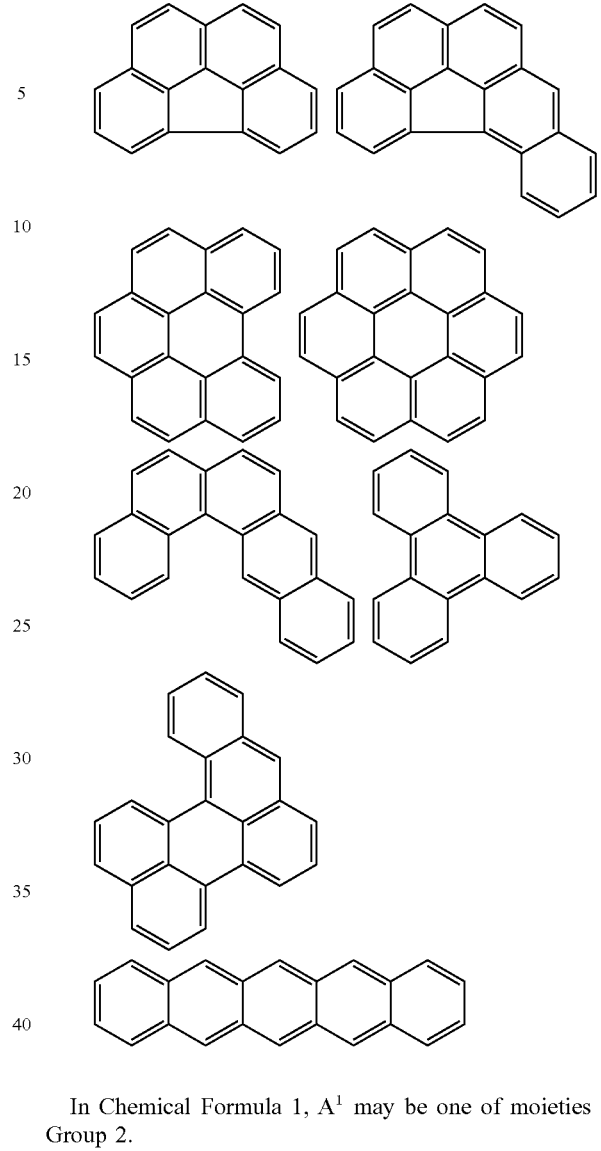
In Chemical Formula 1, $A^1$ may be one of moieties of Group 2.
[Group 2]
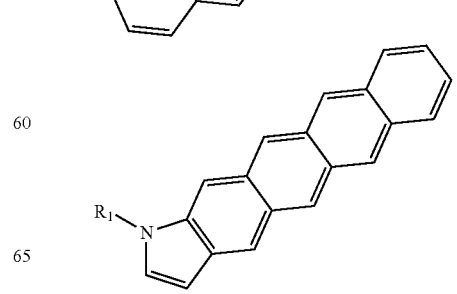

-continued

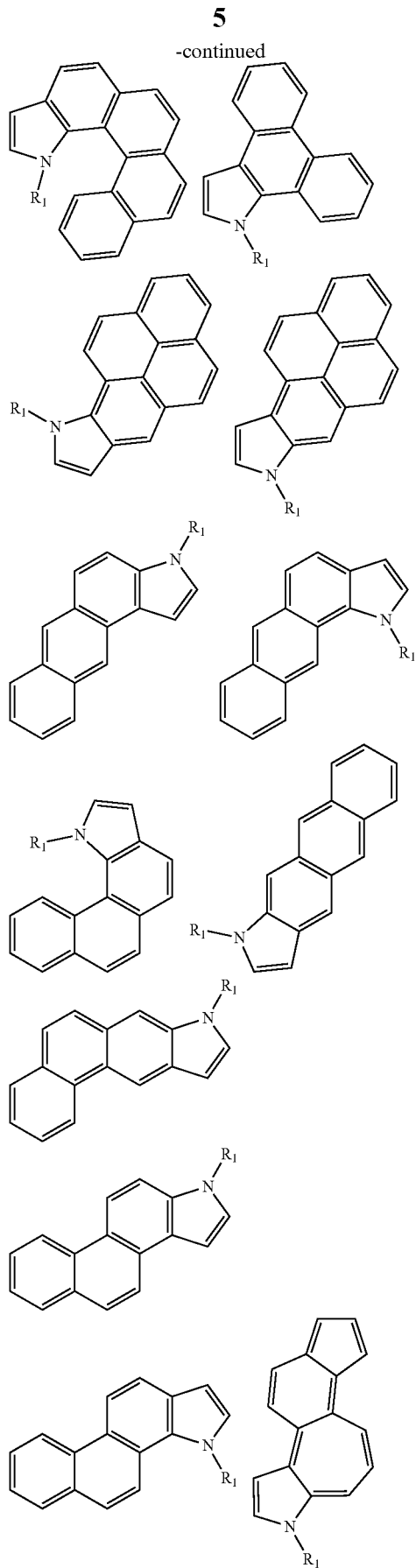

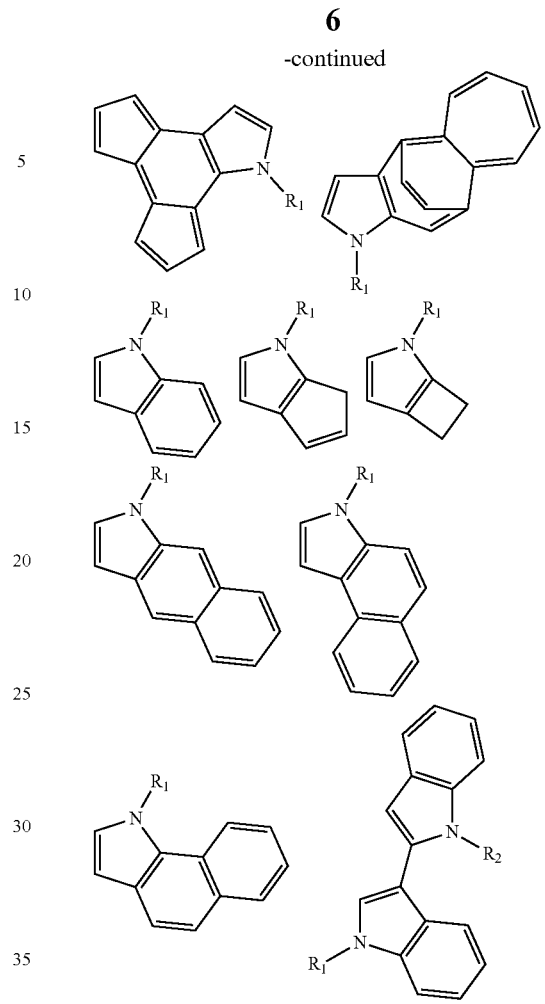

In Group 2,
R$^1$ and R$^2$ are independently hydrogen, a hydroxy group, a halogen, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof:

provided that in Group 2, hydrogen of each moiety may independently be replaced or unreplaced by a hydroxy group, a halogen, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof.

In Chemical Formula 2, A$^2$ may be one of the substituted or unsubstituted moieties of Group 1.

In Chemical Formula 2, A$^2$ may be substituted with at least one hydroxy group.

In Chemical Formulae 1 and 2, B$^1$ and B$^2$ may be a substituted or unsubstituted C6 to C30 aromatic ring and may have the same structure.

A weight average molecular weight of the polymer may be 1,000 to 200,000.

According to another embodiment, an organic layer composition includes the polymer and a solvent.

The polymer may be included in an amount of 0.1 wt % to 30 wt % based on the total amount of the organic layer composition.

According to another embodiment, a method of forming patterns includes providing a material layer on a substrate, applying the organic layer composition including the polymer and a solvent on the material layer, heat-treating the organic layer composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The organic layer composition may be applied using a spin-on coating method.

The method may further include forming a bottom anti-reflective coating (BARC) before forming the photoresist layer.

The polymer according to an embodiment exhibits improved heat resistance and etch resistance. When the polymer is used as an organic layer material, an organic layer having improved film density and etch resistance and satisfying flatness may be provided.

BRIEF DESCRIPTION OF THE DRAWING

The FIGURE is a flowchart explaining a method of forming patterns according to an embodiment.

DETAILED DESCRIPTION

Example embodiments of the present disclosure will hereinafter be described in detail, and may be easily performed by a person skilled in the art. However, this disclosure may be embodied in many different forms and is not construed as limited to the example embodiments set forth herein.

In the present specification, when a definition is not otherwise provided, 'substituted' may refer to replacement of a hydrogen atom of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, sulfonic acid group or a salt thereof, a phosphoric acid or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

In the present specification, when a definition is not otherwise provided, the term 'hetero' refers to one including 1 to 3 heteroatoms selected from N, O, S, and P.

In the present specification, when a definition is not otherwise provided, '*' refer to a linking point of a compound or a compound moiety.

Hereinafter, a polymer according to an embodiment is described.

A polymer according to an embodiment includes a structural unit represented by Chemical Formula 1 and a structural unit represented by Chemical Formula 2.

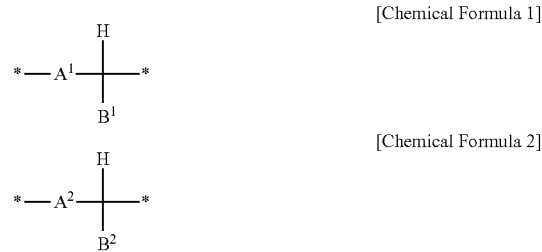

[Chemical Formula 1]

[Chemical Formula 2]

In Chemical Formulae 1 and 2, $A^1$ is a moiety represented by Chemical Formula X, $A^2$ is a substituted or unsubstituted C6 to C30 aromatic ring and has a different structure from $A^1$, $B^1$ and $B^2$ are independently a substituted or unsubstituted C6 to C30 aromatic ring, and

* is a linking point:

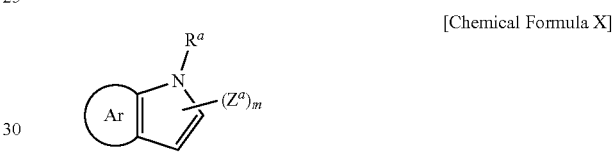

[Chemical Formula X]

wherein, in Chemical Formula X,

Ar is a substituted or unsubstituted tetragonal ring, a substituted or unsubstituted pentagonal ring, a substituted or unsubstituted hexagonal ring, or a fused ring thereof, $R^a$ is hydrogen, a hydroxy group, a halogen, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof, $Z^a$ is independently hydroxy group, a halogen, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof, and m is 0 or 1.

The polymer includes the structural unit represented by Chemical Formula 1 and the structural unit represented by Chemical Formula 2, wherein the numbers and arrangements of these structural units are not limited.

The structural units represented by Chemical Formulae 1 and 2 consist of a first moiety represented by $A^1$ and $A^2$ and a second moiety represented by hydrogen atom (H), carbon, $B^1$, and $B^2$.

In Chemical Formulae 1 and 2, $A^1$ and $A^2$ have a different structure.

First, in Chemical Formula 1, $A^1$ is an indole compound, or a derivative thereof and is represented by Chemical Formula X.

In Chemical Formula X, Ar is a substituted or unsubstituted tetragonal ring, a substituted or unsubstituted pentagonal ring, a substituted or unsubstituted hexagonal ring, or a fused ring thereof, and the fused ring may be for example a fused form of 2, 3, or 4 benzene rings, but is not limited thereto.

In Chemical Formula 1, $A^1$ may be for example one of moieties of Group 2, but is not limited thereto.

[Group 2]

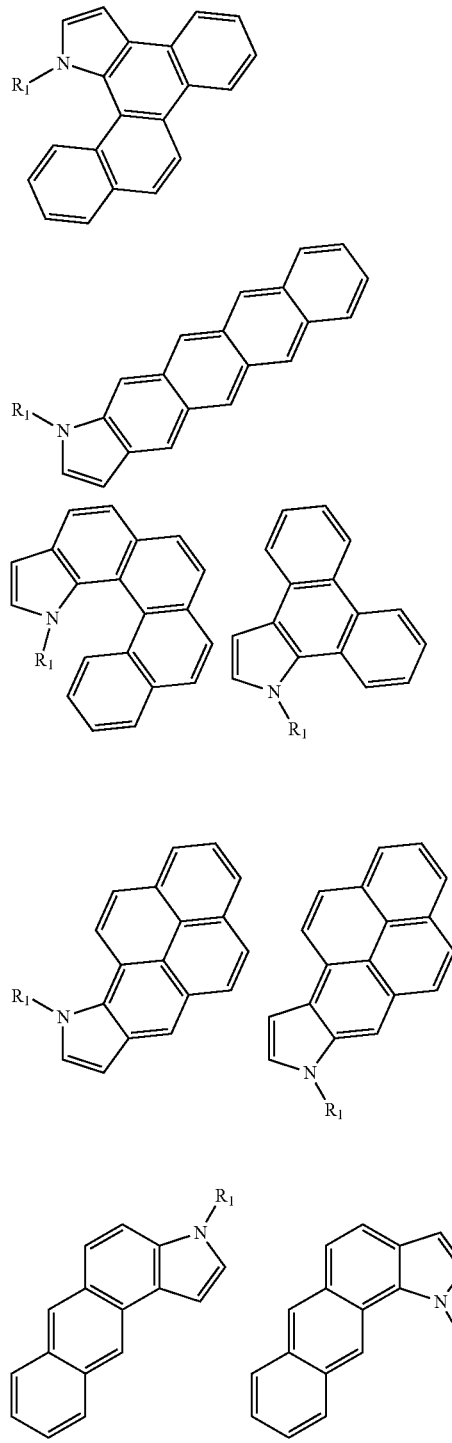
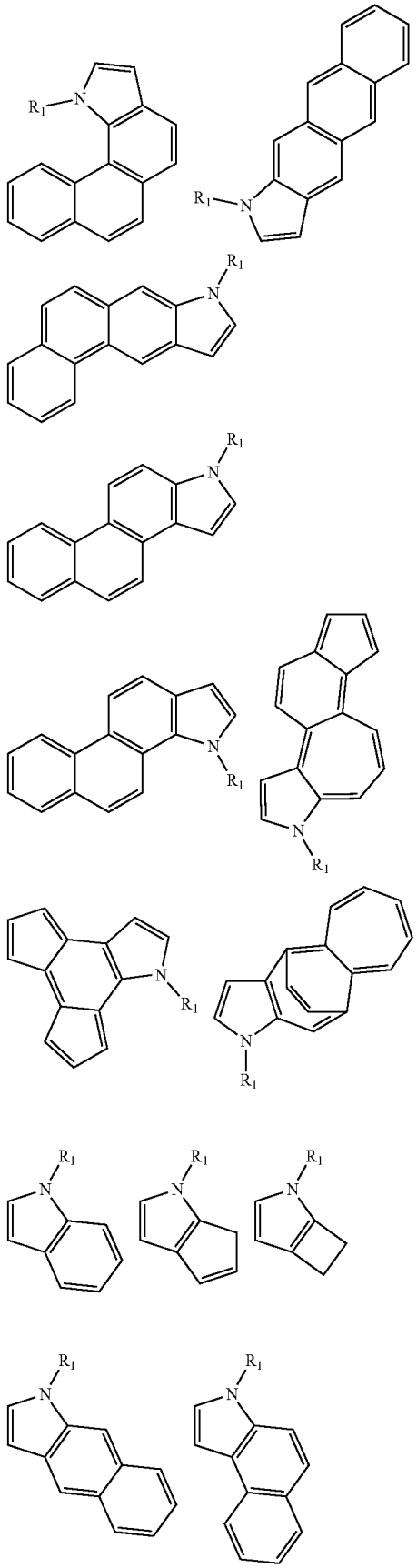

-continued

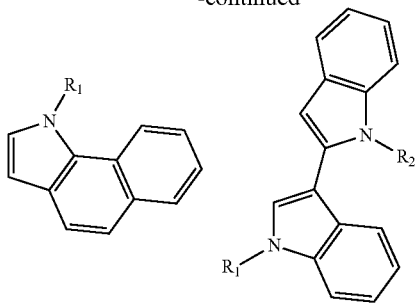

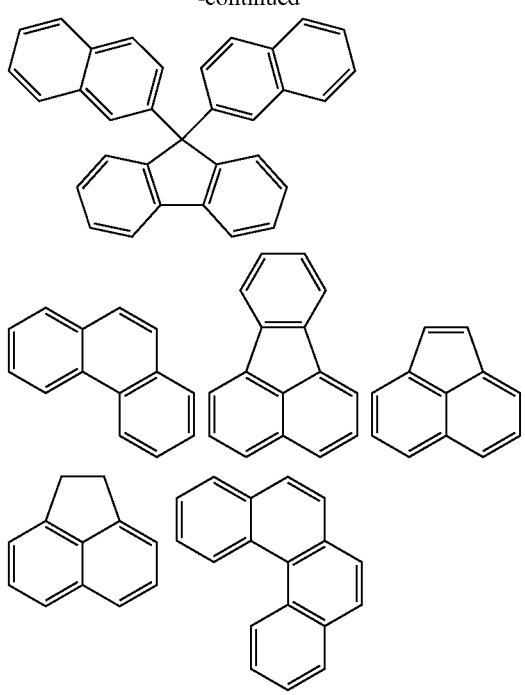

In Group 2,

R¹ and R² are independently hydrogen, a hydroxy group, a halogen, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof:

provided that in Group 2, hydrogen of each moiety may independently be replaced or unreplaced by a hydroxy group, a halogen, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof.

In Group 2, a position where each moiety is linked with Chemical Formula 1 is not particularly limited. Properties of the polymer may be easily controlled by selecting kinds and numbers of substituted functional groups of the cyclic group.

On the other hand, in Chemical Formula 2, A² is a substituted or unsubstituted C6 to C30 aromatic ring and has a different structure from A¹ that is indole, or a derivative thereof.

In Chemical Formula 2, A² may be one of substituted or unsubstituted moieties of Group 1, but is not limited thereto.

[Group 1]

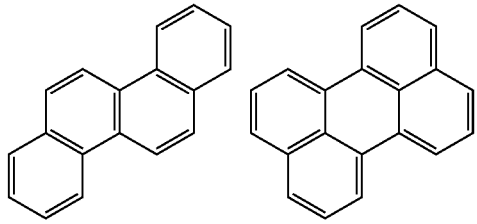

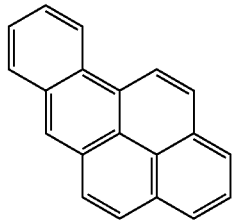

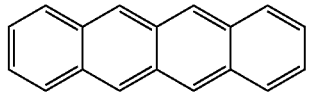

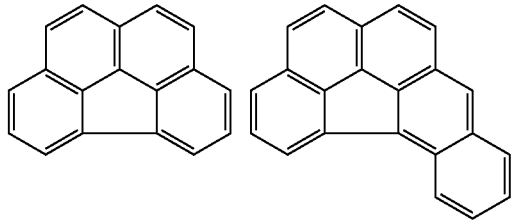

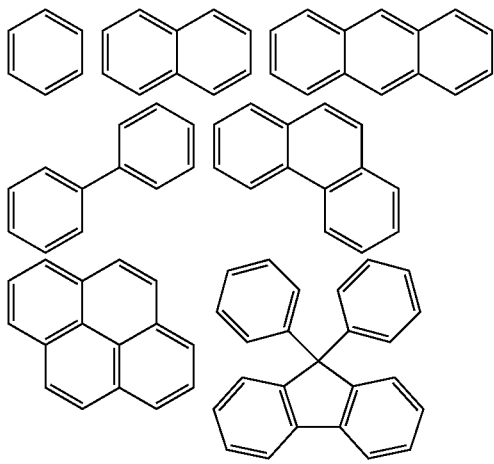

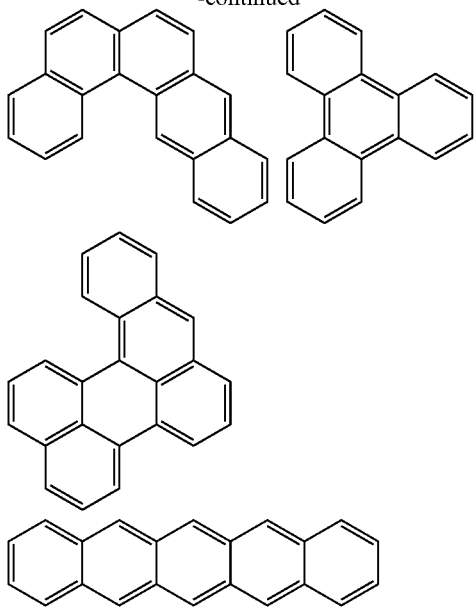

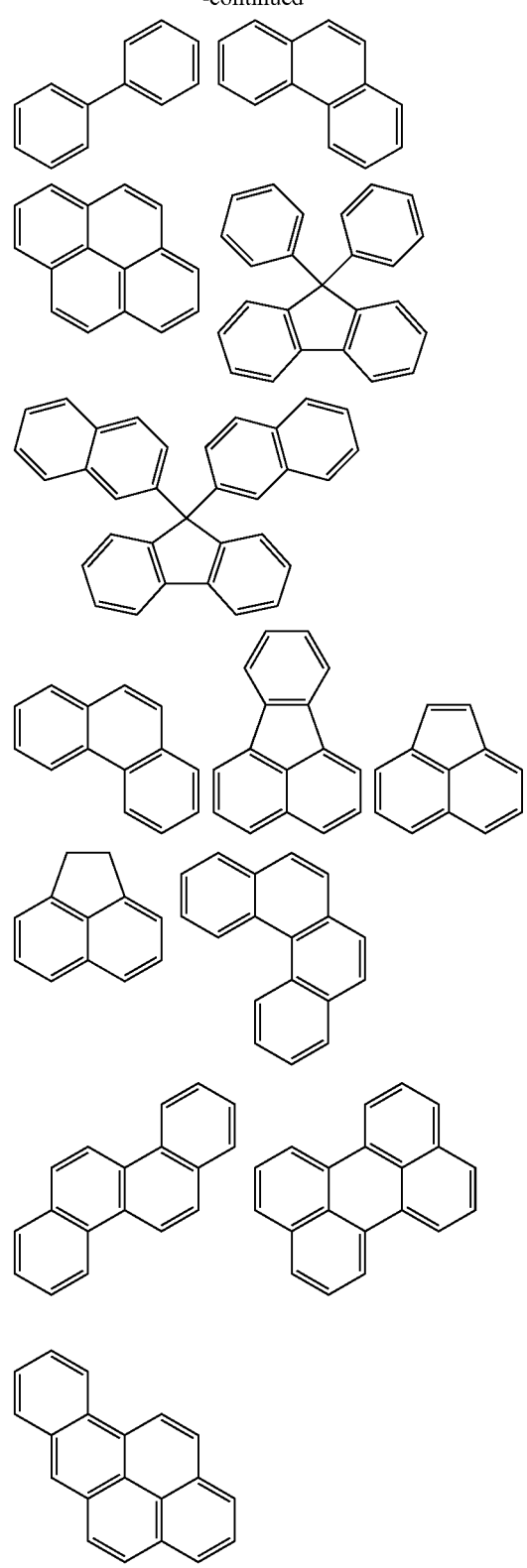

In Group 1, a position where each moiety is linked with Chemical Formula 2 is not particularly limited. For example, when the moieties in Group 1 is substituted, at least one hydrogen in the moieties may be replaced by a hydroxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, or a combination thereof, but is not limited thereto. For example, $A^2$ may be substituted with at least one hydroxy group.

The polymer has cyclic group moieties represented by $A^1$ in Chemical Formula 1 and by $A^2$ in Chemical Formula 2 and thus may secure etch resistance. The polymer includes an indole moiety ($A^1$) in the structural unit represented by Chemical Formula 1 and thus has a structure that one side of a pentagonal ring moiety including a nitrogen atom (N) is closed (fused) by a ring, but the other side thereof is not fused by a ring but open (i.e., one side of the pentagonal ring is fused with Ar, but the other side thereof is not in Chemical Formula X), which may relatively promote bonds inside the polymer or among polymers during the baking compared with a carbazole-based one having a structure that a pentagonal ring moiety including a nitrogen atom is all closed and thus increase a carbon content and accordingly, much improve etch resistance.

As described above, the structural units represented by Chemical Formulae 1 to and 2 includes a second moiety represented by a hydrogen atom (H), carbon, $B^1$, and $B^2$.

For example, in Chemical Formulae 1 and 2, $B^1$ and $B^2$ are each one of substituted or unsubstituted moieties of Group 1, but are not limited thereto.

[Group 1]

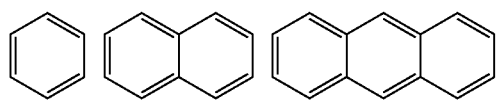

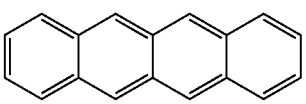

-continued

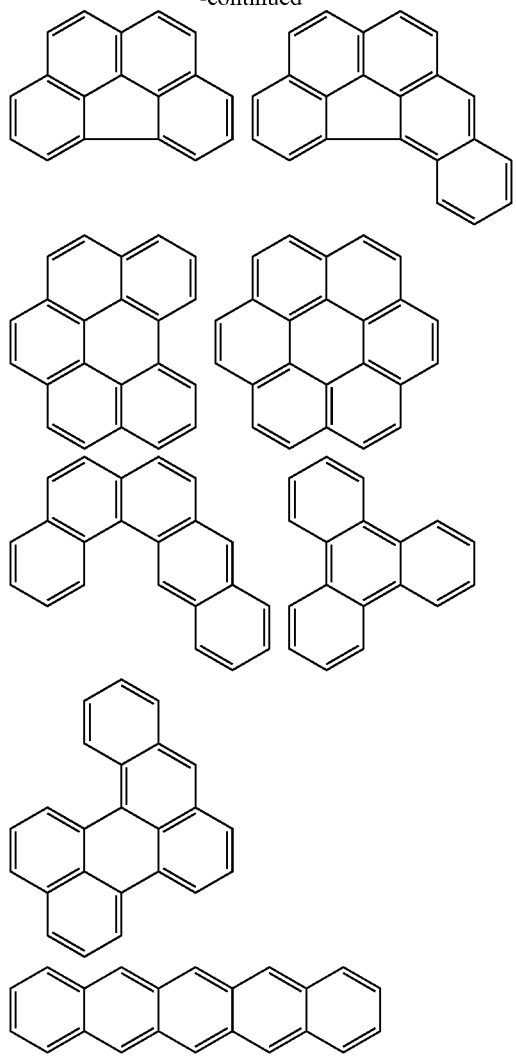

For example, in Chemical Formulae 1 and 2, $B^1$ and $B^2$ may have the same structure.

The polymer includes a carbon cyclic group represented by $A^1$, $A^2$, $B^1$, and $B^2$ and thereby may ensure etch resistance.

On the other hand, carbon included in the second moiety corresponds to 'tertiary carbon.'

Herein, the tertiary carbon indicates carbon of which three hydrogens out of four hydrogens bonded therewith are replaced by other groups except for hydrogen.

The polymer includes the tertiary carbon in all the structural units represented by Chemical Formulae 1 and 2 and thus may have a maximized ring parameter and enhance etch resistance. In addition, when the polymer including this type of carbon is used to prepare an organic layer composition, dissolubility of a hardmask layer may be improved, and thus a spin-on coating may be applied thereto.

The polymer may be obtained for example through a terpolymerization. In the polymer, a tertiary carbon structure may be for example formed by introducing an aldehyde compound or a derivative thereof as an electrophilie during the polymer synthesis. The polymer has the tertiary carbon structure of increasing a carbon content but decreasing the number of hydrogen at a bonding position of monomers through the terpolymerization of the aldehyde compound or the derivative thereof and the monomers having a high carbon content and thus may reinforce etch resistance.

The polymer may have a weight average molecular weight of about 500 to 200,000. More specifically, the polymer may have a weight average molecular weight of about 1,000 to 20,000. When the polymer has a weight average molecular weight within the range, an organic layer composition (e.g., a hardmask composition) including the polymer may be optimized by adjusting the amount of carbon and solubility in a solvent.

When the polymer is used as an organic layer material, a uniform thin layer may not only be obtained without forming a pin-hole or a void and deteriorating a thickness distribution during a baking process, but excellent gap-fill and planarization characteristics may also be obtained when a lower substrate (or a layer) has a step or is patterned.

According to another embodiment, an organic layer composition including the polymer and a solvent is provided.

The solvent may be anyone having sufficient dissolubility or dispersibility or the polymer and may include for example at least one selected from propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methyl pyrrolidone, methyl pyrrolidinone, acetylacetone, and ethyl 3-ethoxypropionate.

The polymer may be included in an amount of about 0.1 to 50 wt %, about 0.1 to 30 wt % or about 0.1 to 15 wt % based on a total amount of the organic layer composition. When the polymer is included within the range, a thickness, surface roughness and planarization of the organic layer may be controlled.

The organic layer composition may further include an additive of a surfactant, a cross-linking agent, a thermal acid generator, or a plasticizer.

The surfactant may include for example a fluoroalkyl-based compound, an alkylbenzene sulfonate salt, an alkyl pyridinium salt, polyethylene glycol, or a quaternary ammonium salt, but is not limited thereto.

The cross-linking agent may be, for example a melamine-based, substituted urea-based, or a polymer-based cross-linking agent. Preferably, it may be a cross-linking agent having at least two cross-linking forming substituents, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylatedurea, butoxymethylatedurea, methoxymethylated thiourea, or butoxymethylated thiourea, and the like.

The cross-linking agent may be a cross-linking agent having high heat resistance. The cross-linking agent having high heat resistance may be a compound including a cross-linking substituent including an aromatic ring (for example a benzene ring, or a naphthalene ring) in the molecule.

The thermal acid generator may be for example an acidic compound such as p-toluene sulfonic acid, trifluoromethane sulfonic acid, pyridinium p-toluene sulfonic acid, salicylic acid, sulfosalicylic acid, citric acid, benzoic acid, hydroxybenzoic acid, naphthalene carbonic acid, and the like or/and 2,4,4,6-tetrabromocyclohexadienone, benzointosylate, 2-nitrobenzyltosylate, other organosulfonic acid alkylester, and the like, but is not limited thereto.

The additive may be present in an amount of about 0.001 to 40 parts by weight based on 100 parts by weight of the organic layer composition. Within the ranges, solubility may be improved while optical properties of the organic layer composition are not changed.

According to another embodiment, an organic layer manufactured using the organic layer composition is provided. The organic layer may be, for example, formed by coating the organic layer composition on a substrate and heat-treating it for curing and may include, for example, a hardmask layer, a planarization layer, a sacrificial layer, a filler, and the like for an electronic device.

Hereinafter, a method of forming patterns using the organic layer composition is described referring to the FIGURE.

The FIGURE is a flowchart showing a method of forming patterns according to an embodiment.

A method of forming patterns according to an embodiment includes providing a material layer on a substrate (S1), applying the organic layer composition including the polymer and the solvent on the material layer (S2), heat-treating the organic layer composition to form a hardmask layer (S3), forming a silicon-containing thin layer on the hardmask layer (S4), forming a photoresist layer on the silicon-containing thin layer (S5), exposing and developing the photoresist layer to form a photoresist pattern (S6), selectively removing the silicon-containing thin layer and the hardmask layer using the photoresist pattern to expose a part of the material layer (S7), and etching an exposed part of the material layer (S8).

The substrate may be, for example a silicon wafer, a glass substrate, or a polymer substrate.

The material layer is a material to be finally patterned, for example a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The organic layer composition is the same as described above, and may be applied by spin-on coating in a form of a solution. Herein, a thickness of the organic layer composition is not particularly limited, but may be for example about 50 Å to 10,000 Å.

The heat-treating of the organic layer composition may be performed for example at about 100° C. to 700° C. for about 10 seconds to 1 hour.

The silicon-containing thin layer may be formed of a material, for example SiCN, SiOC, SiON, SiOCN, SiC, SiO, and/or SiN, and/or the like.

The method may further include forming a bottom anti-reflective coating (BARC) on the silicon-containing thin layer before forming the photoresist layer.

Exposure of the photoresist layer may be performed using, for example ArF, KrF, or EUV. After exposure, heat-treating may be performed at about 100° C. to 700° C.

The etching process of the exposed part of the material layer may be performed through a dry etching process using an etching gas and the etching gas may be, for example $CHF_3$, $CF_4$, $Cl_2$, $BCl_3$, and a mixed gas thereof, without limitation.

The etched material layer may be formed in a plurality of pattern, and the plurality of pattern may be a metal pattern, a semiconductor pattern, an insulation pattern, and the like, for example diverse patterns of a semiconductor integrated circuit device.

Hereinafter, the present disclosure is illustrated in more detail with reference to examples. However, these examples are exemplary, and the present disclosure is not limited thereto.

SYNTHESIS EXAMPLES

Synthesis Example 1

61.5 g (0.43 mol) of 1-naphthol, 50.0 g (0.43 mol) of indole, 133 g (0.85 mol) of 1-naphtaldehyde, and 41.0 g (0.43 mol) of methane sulfonic acid were added to 285.9 g of 1,4-dioxane in a 500 ml 2-necked flask equipped with a mechanical agitator and a condenser, and the mixture was heated up to 100° C. and stirred for 24 hours. When a reaction was complete, an internal temperature of the flask was decreased down to 60 to 70° C., 300 g of tetrahydrofuran was added thereto to prevent a compound from being hardened, and a 7% sodium bicarbonate aqueous solution was used to adjust pH of the compound into 5 to 6. Subsequently, 1000 ml of ethyl acetate was poured thereinto, and the obtained mixture was continuously stirred and then, filtered with a separatory funnel to extract only an organic layer. Then, 500 ml of water was three times repetitively poured through the separatory funnel, and then, the flask was shacked to remove acid and a sodium salt remaining therein to finally extract the organic layer. Subsequently, the obtained organic solution was concentrated with an evaporator to obtain a compound, and 1 L of tetrahydrofuran was added thereto to obtain a solution.

The solution was slowly added in a dropwise fashion to a beaker in which 5 L of hexane was being stirred to form a precipitate and obtain a polymer including structural units shown in Chemical Formula 1a.

When a weight average molecular weight (Mw) and polydispersity (PD) of the polymer were measured by using gel permeation chromatography (GPC), the weight average molecular weight (Mw) was 1,890 and the polydispersity (PD) was 1.35.

[Chemical Formula 1a]

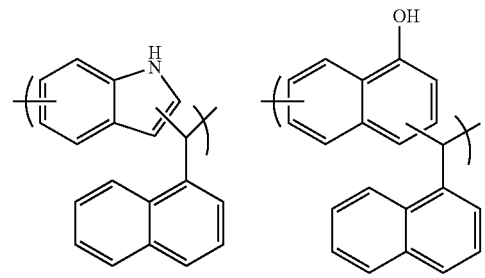

Synthesis Example 2

A polymer including structural units shown in Chemical Formula 2a was obtained according to the same method as Synthesis Example 1 except for using 1H-benzoindole instead of indole.

A weight average molecular weight (Mw) of the polymer was 3,100 and polydispersity (PD) of the polymer was 1.43.

[Chemical Formula 2a]

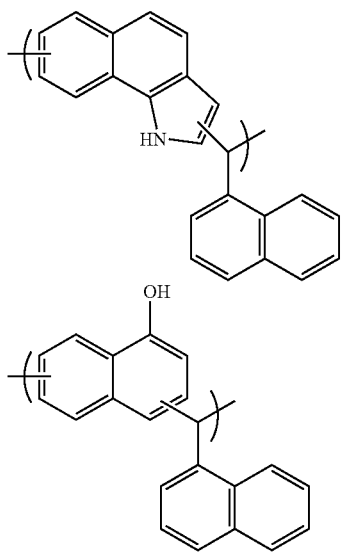

Synthesis Example 3

A polymer including structural units shown in Chemical Formula 3a was obtained according to the same method as Synthesis Example 1 except for using 1H,1H'-3,3'-biindole instead of indole.

A weight average molecular weight (Mw) of the polymer was 2,140 and polydispersity (PD) of the polymer was 1.32.

[Chemical Formula 3a]

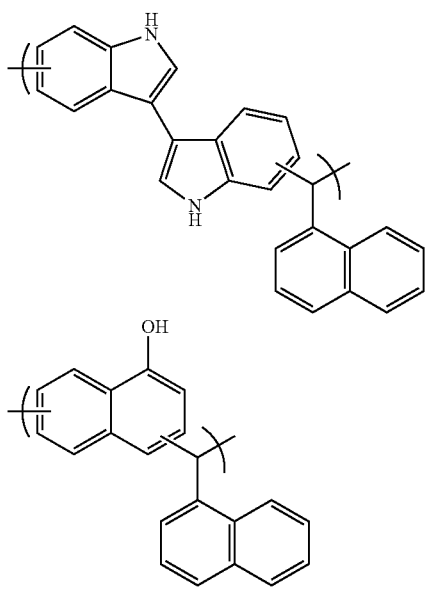

Synthesis Example 4

A polymer including structural units shown in Chemical Formula 4a was obtained according to the same method as Synthesis Example 1 except for using 1H-dibenzo[e,g]indole instead of indole.

A weight average molecular weight (Mw) of the polymer was 2,470 and polydispersity (PD) of the polymer was 1.29.

[Chemical Formula 4a]

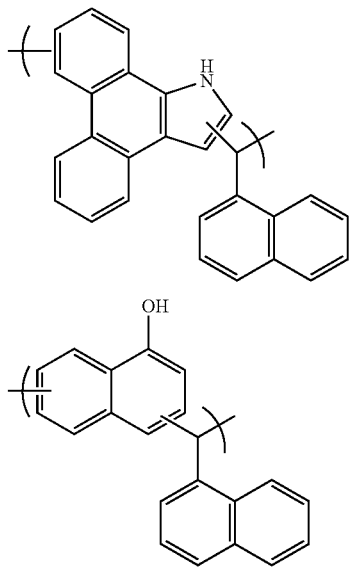

Synthesis Example 5

A polymer including structural units shown in Chemical Formula 5a was obtained according to the same method as Synthesis Example 1 except for using phenanthren-9-ol instead of 1-naphthol.

A weight average molecular weight (Mw) of the polymer was 1,760 and polydispersity (PD) of the polymer was 1.43.

[Chemical Formula 5a]

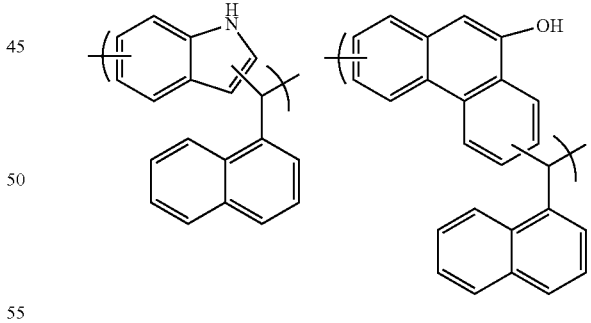

Synthesis Example 6

A polymer including structural units shown in Chemical Formula 6a was obtained according to the same method as Synthesis Example 5 except for using 9-phenanthrene carbaldehyde instead of 1-naphthaldehyde.

A weight average molecular weight (Mw) of the polymer was 2,410 and the polydispersity (PD) of the polymer was 1.55.

[Chemical Formula 6a]

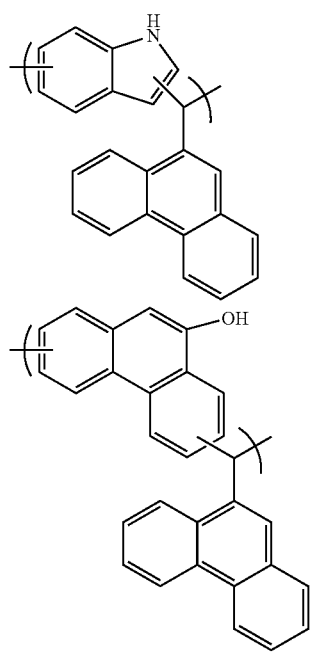

Synthesis Example 7

A polymer including structural units shown in Chemical Formula 7a was obtained according to the same method as Synthesis Example 6 except for using 1-hydroxypyrene instead of phenanthren-9-ol and pyrene-1-carbaldehyde instead of 9-phenanthrene carbaldehyde.

A weight average molecular weight (Mw) of the polymer was 1,570, and polydispersity (PD) of the polymer was 1.26.

[Chemical Formula 7a]

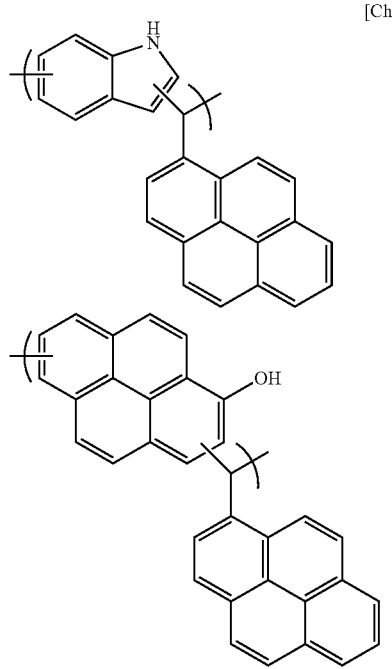

Synthesis Example 8

A polymer including structural units shown in Chemical Formula 8a was obtained according to the same method as Synthesis Example 7 except for using 1H-benzoindole instead of indole.

A weight average molecular weight (Mw) of the polymer was 1,940 and polydispersity (PD) of the polymer was 1.35.

[Chemical Formula 8a]

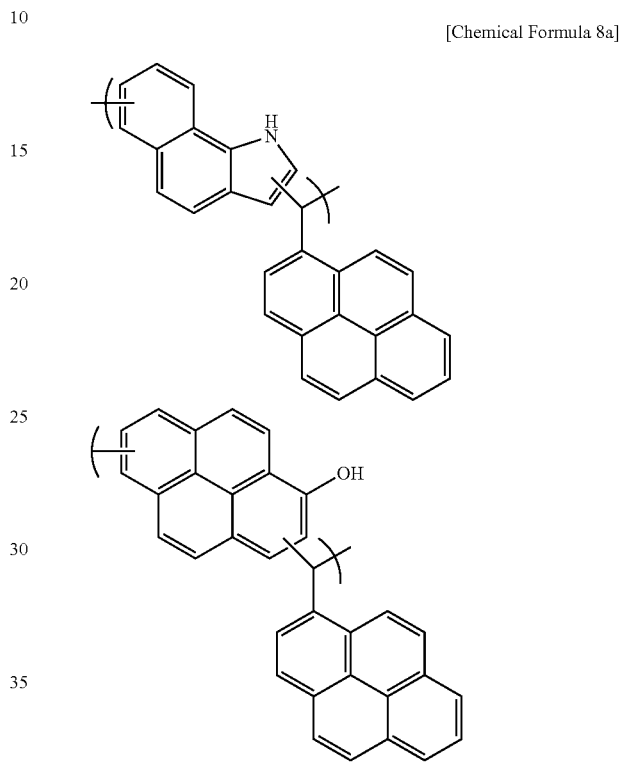

Synthesis Example 9

A polymer including structural units shown in Chemical Formula 9a was obtained according to the same method as Synthesis Example 7 except for using 1-phenyl-1H-indole instead of indole.

A weight average molecular weight (Mw) of the polymer was 1,550 and polydispersity (PD) of the polymer was 1.31.

[Chemical Formula 9a]

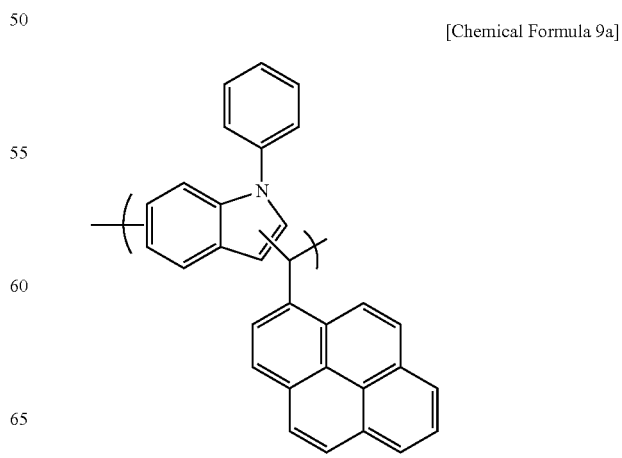

-continued

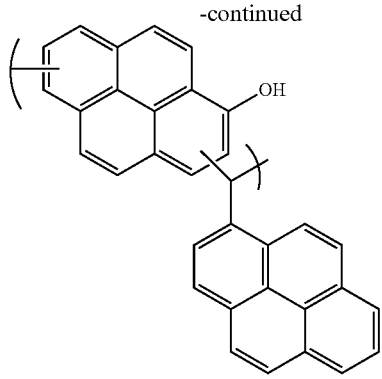

Synthesis Example 10

27.0 g of the polymer according to Synthesis Example 1 and 200 g of dimethyl formamide were put in a 500 ml 2-necked flask equipped with a mechanical agitator and then, stirred. When the polymer was completely dissolved, the flask was put in a cooling water tank filled with ice and stirred. Subsequently, 6 g of sodium hydride was slowly added thereto in a dropwise fashion, and the mixture was stirred. After being stirred for 30 minutes, 17.8 g of propargyl bromide was slowly added thereto, and the obtained mixture was stirred for 8 hours. When a reaction was complete, 50 ml of ethanol was slowly put in the flask, and the obtained reaction solution was slowly added to 1.5 L of water stirred in a 2 L beaker after 10 minutes. When the addition was completed, the obtained mixture was stirred for 2 hours. A solid precipitated therein was filtered, after removing moisture therefrom, three times repetitively washed with a mixture of 500 ml of water and 200 ml of ethanol, and dried to obtain a polymer including a structural unit represented by Chemical Formula 10a.

A weight average molecular weight (Mw) of the polymer was 1,920 and polydispersity (PD) of the polymer was 1.34.

[Chemical Formula 10a]

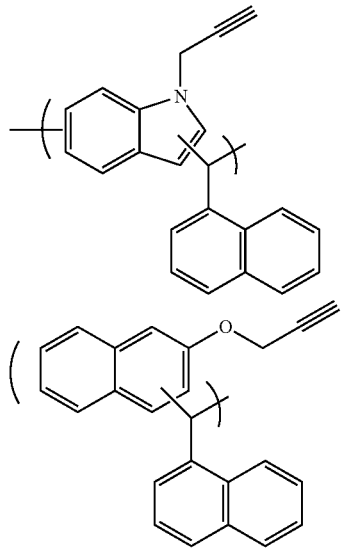

Comparative Synthesis Example 1

20 g (0.103 mol) of 1-hydroxyanthracene and 3.08 g (0.103 mol) of paraformaldehyde were sequentially put in a 500 ml flask and dissolved in 42 g of propylene glycol monomethyl ether acetate (PGMEA), 0.4 g (0.002 mol) of para toluene sulfonic acid was added thereto, and the mixture was stirred at 90 to 120° C. for 5 to 10 hours. When a sample taken from the polymerization reactant every hour has a weight average molecular weight of 3,000 to 4,200, a reaction was completed to obtain a polymer including a structural unit represented by Chemical Formula A.

A weight average molecular weight (Mw) of the polymer was 3,200, and polydispersity (PD) of the polymer was 1.85.

[Chemical Formula A]

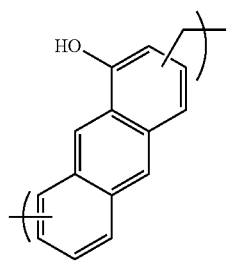

Comparative Synthesis Example 2

33 g (0.23 mol) of indole and 35.9 g (0.23 mol) of 1-naphthaldehyde were sequentially put in a 500 ml flask and then, dissolved in 200 g of propylene glycol monomethyl ether acetate (PGMEA), 1 g (0.005 mol) of para toluenesulfonic acid was added thereto, and the mixture was stirred at 90 to 120° C. for around 8 hours. When a sample taken from the polymerization reactant every hour had a weight average molecular weight of 3,000 to 4,000, a reaction was completed to obtain a polymer including a structural unit represented by Chemical Formula B.

A weight average molecular weight (Mw) of the polymer was 1,520, and polydispersity (PD) of the polymer was 1.72.

[Chemical Formula B]

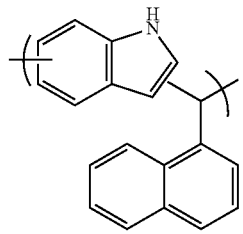

Comparative Synthesis Example 3

A polymer including structural units shown in Chemical Formula C was obtained according to the same method as Synthesis Example 1 except for using carbazole instead of the indole.

A weight average molecular weight (Mw) of the polymer was 2,680, and polydispersity (PD) of the polymer was 1.56.

[Chemical Formula C]

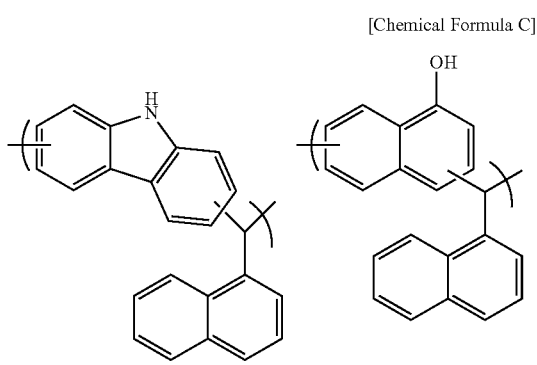

Comparative Synthesis Example 4

A polymer including structural units shown in Chemical Formula D was obtained according to the same method as Synthesis Example 4 except for using 1,3-dihydroindolo[2,3-b]carbazole instead of the indole.

A weight average molecular weight (Mw) of the polymer was 4,620, and polydispersity (PD) of the polymer was 1.73.

[Chemical Formula D]

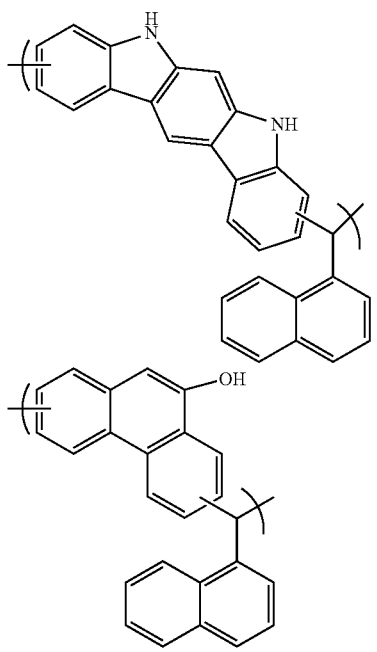

Preparation of Hardmask Compositions

Example 1

The polymer according to Synthesis Example 1 was dissolved in a mixed solvent of propylene glycolmonomethyl ether acetate (PGMEA) and cyclohexanone (7:3 (v/v)), and the solution was filtered through a 0.1 μm TEFLON (tetrafluoroethylene) filter to prepare a hardmask composition. The polymer was used in an amount of 5.0 wt % to 20.0 wt % based on the entire weight of the hardmask composition depending on a thickness.

Example 2

A hardmask composition was prepared according to the same as Example 1 except for using the compound of Synthesis Example 2 instead of the polymer of Synthesis Example 1.

Example 3

A hardmask composition was prepared according to the same as Example 1 except for using the compound of Synthesis Example 3 instead of the polymer of Synthesis Example 1.

Example 4

A hardmask composition was prepared according to the same as Example 1 except for using the compound of Synthesis Example 4 instead of the polymer of Synthesis Example 1.

Example 5

A hardmask composition was prepared according to the same as Example 1 except for using the compound of Synthesis Example 5 instead of the polymer of Synthesis Example 1.

Example 6

A hardmask composition was prepared according to the same as Example 1 except for using the compound of Synthesis Example 6 instead of the polymer of Synthesis Example 1.

Example 7

A hardmask composition was prepared according to the same as Example 1 except for using the compound of Synthesis Example 7 instead of the polymer of Synthesis Example 1.

Example 8

A hardmask composition was prepared according to the same as Example 1 except for using the compound of Synthesis Example 8 instead of the polymer of Synthesis Example 1.

Example 9

A hardmask composition was prepared according to the same as Example 1 except for using the compound of Synthesis Example 9 instead of the polymer of Synthesis Example 1.

Example 10

A hardmask composition was prepared according to the same as Example 1 except for using the compound of Synthesis Example 10 instead of the polymer of Synthesis Example 1.

Comparative Example 1

A hardmask composition was prepared according to the same as Example 1 except for using the compound of Comparative Synthesis Example 1 instead of the polymer of Synthesis Example 1.

Comparative Example 2

A hardmask composition was prepared according to the same as Example 1 except for using the compound of Comparative Synthesis Example 2 instead of the polymer of Synthesis Example 1.

Comparative Example 3

A hardmask composition was prepared according to the same as Example 1 except for using the compound of Comparative Synthesis Example 3 instead of the polymer of Synthesis Example 1.

Comparative Example 4

A hardmask composition was prepared according to the same as Example 1 except for using the compound of Comparative Synthesis Example 4 instead of the polymer of Synthesis Example 1.

EVALUATION

Evaluation 1: Etch Resistance

Each hardmask composition according to Examples 1 to 10 and Comparative Examples 1 to 4 was spin-on coated at a thickness of 4,000 Å on a silicon wafer and heat-treated on a hot plate at 240° C. for 1 minute, respectively to form each thin film.

Subsequently, the thickness of each thin film was measured. Then, the thin films were respectively dry-etched by using a $CHF_3/CF_4$ mixed gas and a $N_2/O_2$ mixed gas for 100 seconds and for 60 seconds respectively, and its thickness was measured again. The thicknesses of the thin films before and after the dry etching and their etching times were used to calculate a bulk etch rate (BER) according to Calculation Equation 1.

(Initial thin film thickness—Thin film thickness after etching)/Etching time (Å/s)    [Calculation Equation 1]

The results are shown in Table 1.

TABLE 1

| | Bulk etch rate (Å/sec) | |
| --- | --- | --- |
| | $CHF_3/CF_4$ mixed gas | $N_2/O_2$ gas |
| Example 1 | 26.7 | 25.6 |
| Example 2 | 25.1 | 25.9 |
| Example 3 | 27.3 | 23.2 |
| Example 4 | 24.6 | 24.9 |
| Example 5 | 26.2 | 24.8 |
| Example 6 | 25.4 | 23.1 |
| Example 7 | 22.9 | 22.7 |
| Example 8 | 22.5 | 22.4 |
| Example 9 | 22.3 | 21.9 |
| Example 10 | 26.9 | 25.0 |

TABLE 1-continued

| | Bulk etch rate (Å/sec) | |
| --- | --- | --- |
| | $CHF_3/CF_4$ mixed gas | $N_2/O_2$ gas |
| Comparative Example 1 | 29.4 | 28.4 |
| Comparative Example 2 | 28.7 | 29.5 |
| Comparative Example 3 | 30.2 | 27.7 |
| Comparative Example 4 | 29.4 | 27.5 |

Etch rates were calculated by changing the heat treatment temperature and time into 400° C. and 2 minutes, respectively. The results are shown in Table 2.

TABLE 2

| | Bulk etch rate (Å/sec) | |
| --- | --- | --- |
| | $CHF_3/CF_4$ mixed gas | $N_2/O_2$ gas |
| Example 1 | 27.8 | 24.5 |
| Example 2 | 26.2 | 24.7 |
| Example 3 | 28.3 | 22.4 |
| Example 4 | 25.2 | 22.5 |
| Example 5 | 27.1 | 23.0 |
| Example 6 | 24.9 | 22.1 |
| Example 7 | 23.7 | 21.2 |
| Example 8 | 23.2 | 21.9 |
| Example 9 | 23.3 | 21.5 |
| Example 10 | 28.1 | 23.9 |
| Comparative Example 1 | 31.1 | 27.0 |
| Comparative Example 2 | 30.2 | 26.6 |
| Comparative Example 3 | 31.4 | 26.4 |
| Comparative Example 4 | 30.7 | 25.5 |

Referring to Tables 1 and 2, each thin film respectively formed of the hardmask compositions according to Examples 1 to 10 showed improved bulk etch characteristics due to sufficient etch resistance against etching gas compared with the films formed of the hardmask composition according to Comparative Examples 1 to 4.

Evaluation 2: Film Density

Each hardmask composition according to Examples 1 to 10 and Comparative Examples 1 to 4 was spin-on coated on a silicon wafer and heat-treated on a hot plate at 240° C. for 1 minute, respectively to form each thin film having a thickness of 1,000 Å.

Film density of each thin film was measured using an X-ray diffraction analysis equipment of PANalytical, Inc.

The results are shown in Table 3.

TABLE 3

| | Film density (g/cm³) |
| --- | --- |
| Example 1 | 1.30 |
| Example 2 | 1.31 |
| Example 3 | 1.39 |
| Example 4 | 1.38 |
| Example 5 | 1.32 |
| Example 6 | 1.40 |
| Example 7 | 1.41 |
| Example 8 | 1.38 |
| Example 9 | 1.39 |
| Example 10 | 1.36 |
| Comparative Example 1 | 1.19 |
| Comparative Example 2 | 1.20 |
| Comparative Example 3 | 1.25 |
| Comparative Example 4 | 1.24 |

Referring to Table 3, each thin film formed of the hardmask compositions according to Examples 1 to 10 showed high film density compared with the films formed of the hardmask composition according to Comparative Examples 1 to 4.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:
1. A polymer comprising
a structural unit represented by Chemical Formula 1, and
a structural unit represented by Chemical Formula 2:

[Chemical Formula 1]

$$*-A^1-\overset{H}{\underset{B^1}{|}}-*$$

[Chemical Formula 2]

$$*-A^2-\overset{H}{\underset{B^2}{|}}-*$$

wherein, in Chemical Formulae 1 and 2,
$A^1$ is a moiety represented by Chemical Formula X,
$A^2$ is one of substituted or unsubstituted moieties of Group 1-1,
$B^1$ and $B^2$ are independently a substituted or unsubstituted C6 to C30 aromatic ring, and * is a linking point:

[Chemical Formula X]

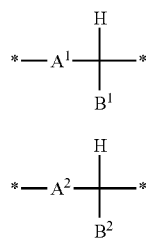

wherein, in Chemical Formula X,
Ar is a substituted or unsubstituted hexagonal ring, or a C7 to C14 fused ring thereof,
$R^a$ is hydrogen, a substituted or unsubstituted C1 to C30 alkyl group, a substituted or unsubstituted C2 to C30 alkynyl group, or a substituted or unsubstituted C6 to C30 aryl group,
$Z^a$ is a substituted or unsubstituted indole, and
m is 0 or 1,

[Group 1-1]

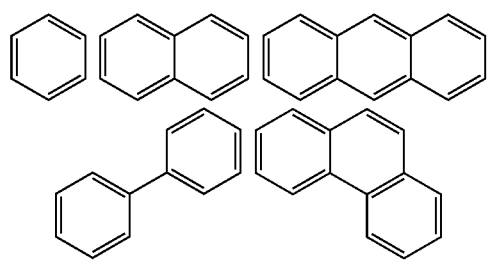

-continued

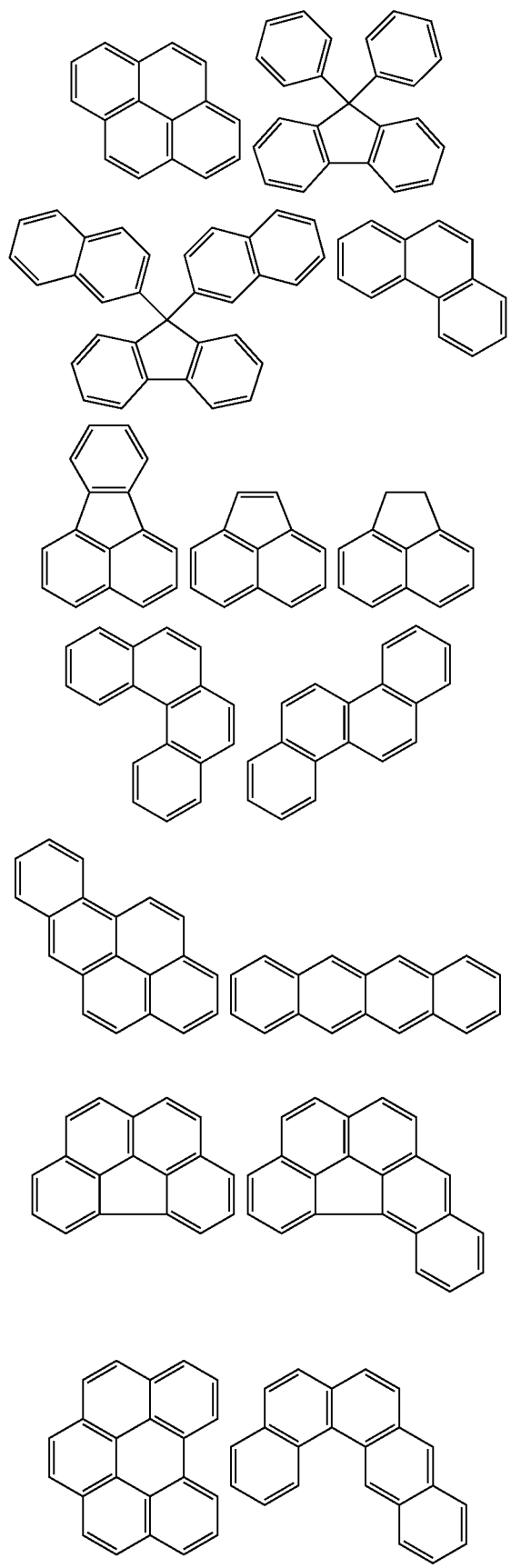

-continued
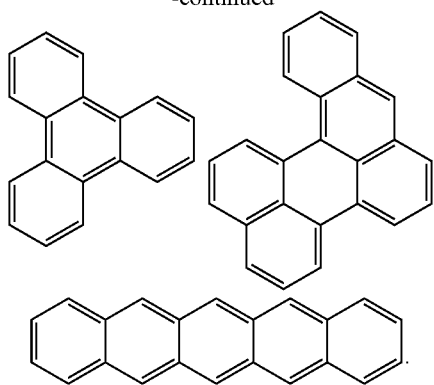
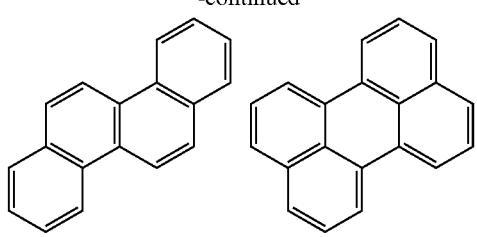
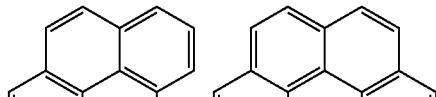
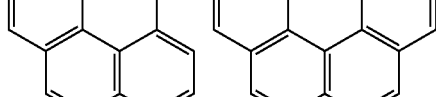
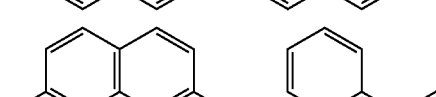
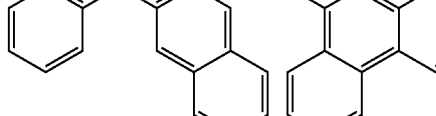
2. The polymer of claim 1, wherein in Chemical Formulae 1 and 2, $B^1$ and $B^2$ are independently one of substituted or unsubstituted moieties of Group 1:
[Group 1]
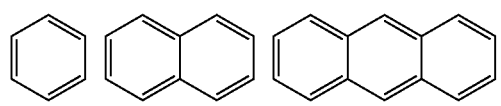
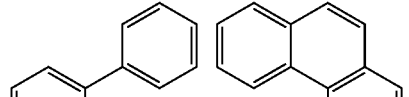
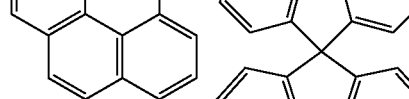
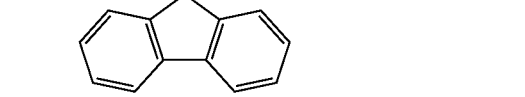
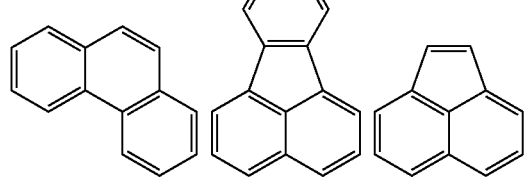
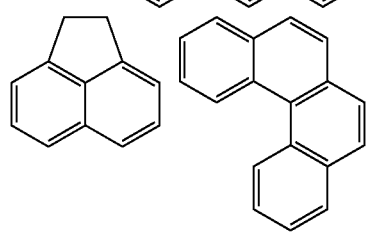
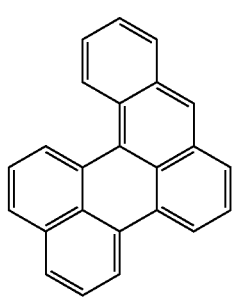
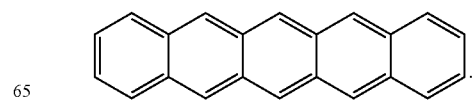

3. The polymer of claim 1, wherein in Chemical Formula 1, $A^1$ is one of moieties of Group 2:

[Group 2]

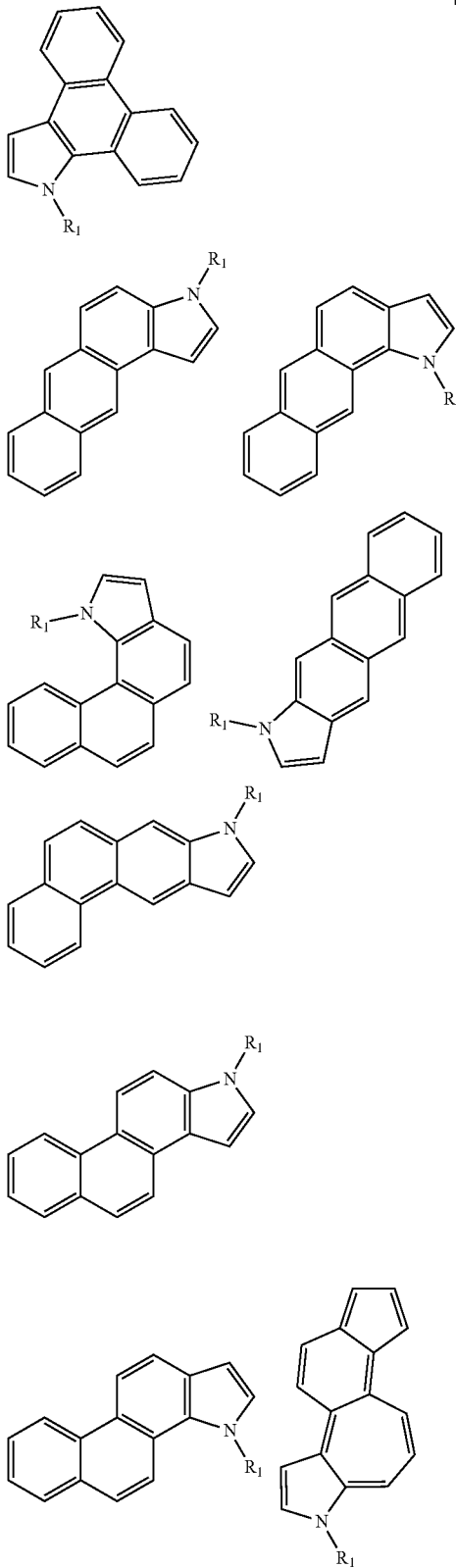

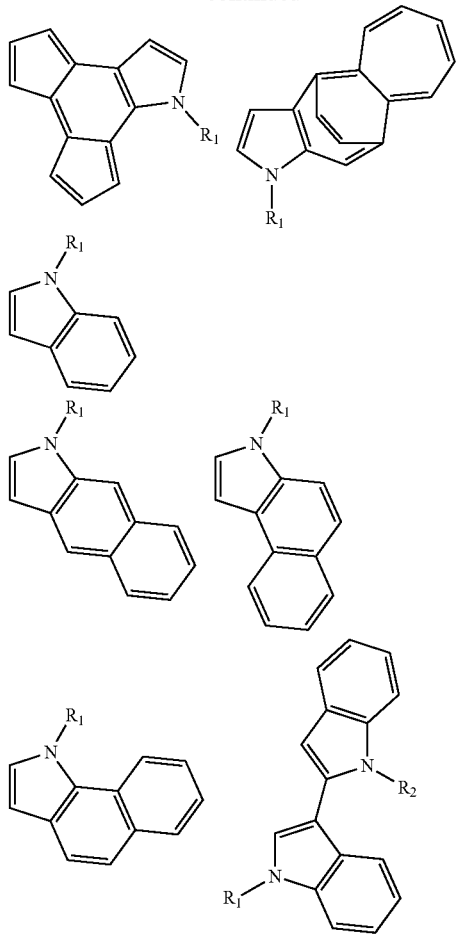

wherein, in Group 2, $R^1$ and $R^2$ are independently hydrogen, a substituted or unsubstituted C1 to C30 alkyl group, a substituted or unsubstituted C2 to C30 alkynyl group, a substituted or unsubstituted C6 to C30 aryl group, or a combination thereof:

provided that in Group 2, hydrogen of each moiety is independently replaced or unreplaced by a hydroxy group, a halogen, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof.

4. The polymer of claim 1, wherein $A^2$ is substituted with at least one hydroxy group.

5. The polymer of claim 1, wherein in Chemical Formulae 1 and 2, $B^1$ and $B^2$ are a substituted or unsubstituted C6 to C30 aromatic ring and have the same structure.

6. The polymer of claim 1, wherein a weight average molecular weight is 1,000 to 200,000.

7. An organic layer composition, comprising a polymer including a structural unit represented by Chemical Formula 1 and a structural unit represented by Chemical Formula 2, and a solvent:

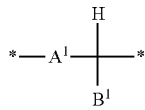
[Chemical Formula 1]

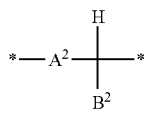
[Chemical Formula 2]

wherein, in Chemical Formulae 1 and 2, $A^1$ is a moiety represented by Chemical Formula X, $A^2$ is one of substituted or unsubstituted moieties of Group 1-1, $B^1$ and $B^2$ are independently a substituted or unsubstituted C6 to C30 aromatic ring, and

* is a linking point:

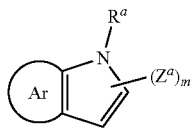
[Chemical Formula X]

wherein, in Chemical Formula X,

Ar is a substituted or unsubstituted hexagonal ring, or a C7 to C14 fused ring thereof, $R^a$ is hydrogen, a substituted or unsubstituted C1 to C30 alkyl group, a substituted or unsubstituted C2 to C30 alkynyl group, or a substituted or unsubstituted C6 to C30 aryl group, $Z^a$ is a substituted or unsubstituted indole, and m is 0 or 1,

[Group 1-1]

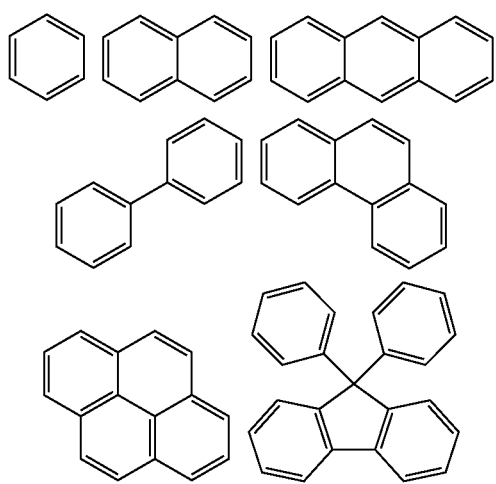

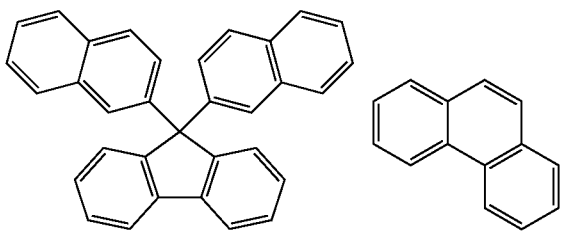

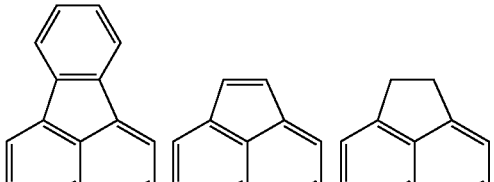

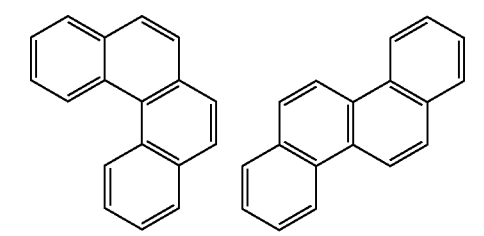

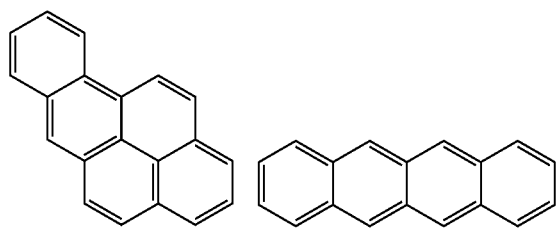

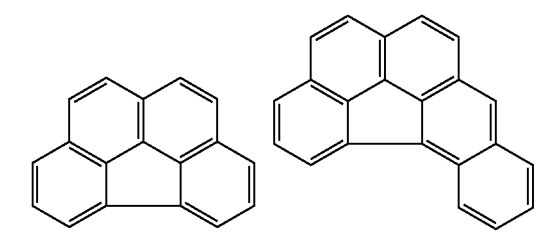

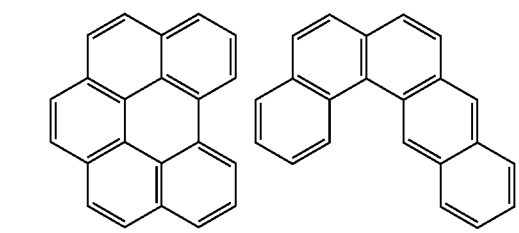

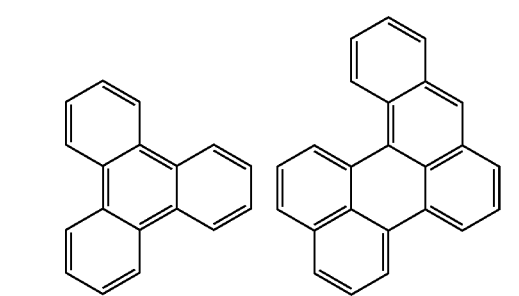

-continued

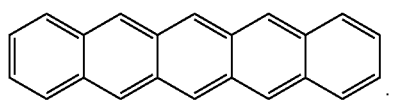

8. The organic layer composition of claim 7, wherein in Chemical Formula 1, $A^1$ is one of moieties of Group 2:

[Group 2]

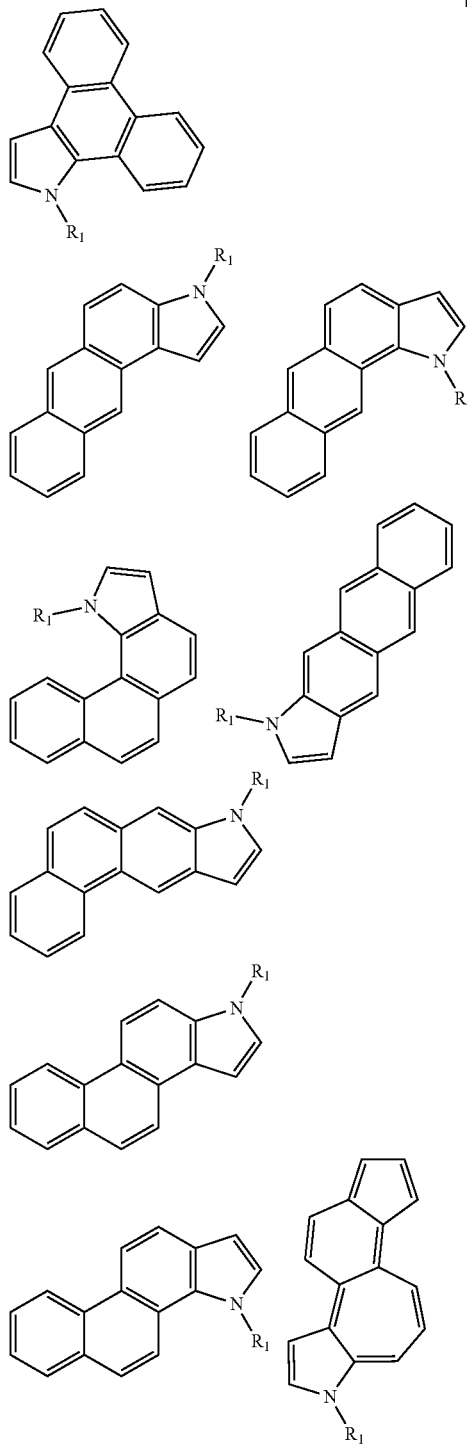

-continued

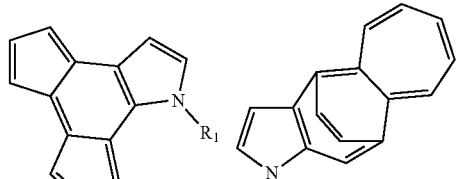

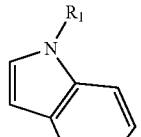

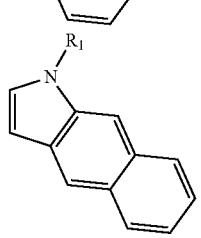
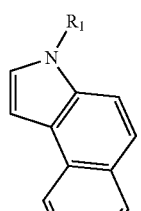

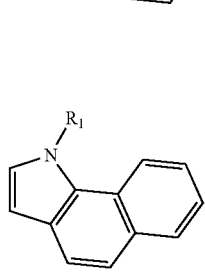
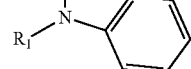

wherein, in Group 2,
$R^1$ and $R^2$ are independently hydrogen, a substituted or unsubstituted C1 to C30 alkyl group, a substituted or unsubstituted C2 to C30 alkynyl group, a substituted or unsubstituted C6 to C30 aryl group, or a combination thereof:
provided that in Group 2, hydrogen of each moiety is independently replaced or unreplaced by a hydroxy group, a halogen, a substituted or unsubstituted C1 to C30 alkoxy group, a substituted or unsubstituted C1 to C30 alkyl group, a substituted or unsubstituted C2 to C30 alkenyl group, a substituted or unsubstituted C2 to C30 alkynyl group, a substituted or unsubstituted C6 to C30 aryl group, a substituted or unsubstituted C1 to C30 heteroalkyl group, a substituted or unsubstituted C2 to C30 heteroaryl group, or a combination thereof.

9. The organic layer composition of claim 7, wherein $A^2$ is substituted with at least one hydroxy group.

10. The organic layer composition of claim 7, wherein in Chemical Formulae 1 and 2, $B^1$ and $B^2$ are a substituted or unsubstituted C6 to C30 aromatic ring and have the same structure.

11. The organic layer composition of claim 7, wherein weight average molecular weight of the polymer is 1,000 to 200,000.

12. The organic layer composition of claim 7, wherein the polymer is included in an amount of 0.1 wt % to 30 wt % based on the total amount of the organic layer composition.

13. A method of forming patterns, comprising
providing a material layer on a substrate,
applying the organic layer composition of claim 7 on the material layer,
heat-treating the organic layer composition to form a hardmask layer,
forming a silicon-containing thin layer on the hardmask layer,
forming a photoresist layer on the silicon-containing thin layer,
exposing and developing the photoresist layer to form a photoresist pattern,
selectively removing the silicon-containing thin layer and the hardmask layer using the photoresist pattern to expose a part of the material layer, and
etching an exposed part of the material layer.

14. The method of claim 13, wherein organic layer composition is applied using a spin-on coating method.

15. The method of claim 13, wherein the method further includes forming a bottom antireflective coating (BARC) before forming the photoresist layer.

\* \* \* \* \*